US011011816B2

(12) United States Patent
Shi

(10) Patent No.: US 11,011,816 B2
(45) Date of Patent: May 18, 2021

(54) RADAR ASSEMBLY WITH A SLOT TRANSITION THROUGH A PRINTED CIRCUIT BOARD

(71) Applicant: Aptiv Technologies Limited, St. Michael (BB)

(72) Inventor: Shawn Shi, Thousand Oaks, CA (US)

(73) Assignee: Aptiv Technologies Limited, St. Michael (BB)

( * ) Notice: Subject to any disclaimer, the term of this patent is extended or adjusted under 35 U.S.C. 154(b) by 303 days.

(21) Appl. No.: 16/175,501

(22) Filed: Oct. 30, 2018

(65) Prior Publication Data

US 2020/0136225 A1    Apr. 30, 2020

Related U.S. Application Data

(60) Provisional application No. 62/752,130, filed on Oct. 29, 2018.

(51) Int. Cl.
*H01Q 1/22* (2006.01)
*H01P 5/08* (2006.01)
(Continued)

(52) U.S. Cl.
CPC ............... *H01P 5/08* (2013.01); *H01L 23/66* (2013.01); *H01P 3/123* (2013.01); *H01Q 1/2283* (2013.01);
(Continued)

(58) Field of Classification Search
CPC ...... H01Q 1/2283; H01Q 13/10; H01L 23/66; H01P 3/121–3/123; H01P 5/08
See application file for complete search history.

(56) References Cited

U.S. PATENT DOCUMENTS 8,040,286 B2 * 10/2011 Matsuo ................. H01P 5/02
343/771
9,196,958 B2 * 11/2015 Arnold ................. H01L 23/66
(Continued)

FOREIGN PATENT DOCUMENTS

DE  102014200660 A1   7/2015
WO    2004063767 A1   7/2004

OTHER PUBLICATIONS

European Search Report for Application No. 19199951, European Patent Office, dated Mar. 18, 2020.
(Continued)

*Primary Examiner* — Hasan Z Islam
(74) *Attorney, Agent, or Firm* — Colby Nipper PLLC

(57) ABSTRACT

A radar assembly includes a monolithic-microwave-integrated-circuit (MMIC), an antenna-element, and a single printed-circuit-board (PCB). The MMIC includes an arrangement of solder-balls configured to couple radar-signals into or out of the MMIC. The antenna-element includes a ridge-air-waveguide configured to propagate radar-signals to or from one or more radiation-slots of the antenna-element. The PCB is directly attached to the MMIC. The PCB includes a transition-feature configured to couple radar-signals between the arrangement of solder-balls and the ridge-air-waveguide. The transition-feature is characterized as a slot that extends between the arrangement of solder-balls and the ridge-air-waveguide. The transition-feature may be an L-shaped-slot or a U-shaped-slot. The assembly is designed/configured to be compatible with known printed circuit board fabrication processes.

17 Claims, 8 Drawing Sheets

(51) Int. Cl.
*H01L 23/66* (2006.01)
*H01P 3/123* (2006.01)
*H01Q 13/10* (2006.01)
*H05K 1/02* (2006.01)
*H05K 1/18* (2006.01)

(52) U.S. Cl.
CPC ........... *H01Q 13/10* (2013.01); *H05K 1/0243* (2013.01); *H05K 1/181* (2013.01); *H01L 2223/6627* (2013.01); *H01L 2223/6677* (2013.01); *H01L 2223/6683* (2013.01); *H05K 2201/10098* (2013.01); *H05K 2201/10734* (2013.01)

(56) References Cited

U.S. PATENT DOCUMENTS

| | | |
|---|---|---|
| 2006/0202312 A1 | 9/2006 | Iijima et al. |
| 2018/0233465 A1* | 8/2018 | Spella ................... H01Q 15/10 |
| 2018/0277962 A1* | 9/2018 | Kamo ................. H01Q 21/064 |
| 2019/0035749 A1* | 1/2019 | Dalmia ................. H01L 23/552 |
| 2019/0139914 A1* | 5/2019 | Kirino ..................... H01P 3/085 |

OTHER PUBLICATIONS

English Abstract Translation for DE 102014200660, published Jul. 16, 2015.

\* cited by examiner

RADAR ASSEMBLY WITH A SLOT TRANSITION THROUGH A PRINTED CIRCUIT BOARD

TECHNICAL FIELD OF INVENTION

This disclosure generally relates to a radar assembly, and more particularly relates to a transition-feature configured through a printed-circuit-board of the radar assembly, where the transition-feature is characterized as a slot that extends between an arrangement of solder-balls on a monolithic-microwave-integrated-circuit (MMIC) and the ridge-air-waveguide of the radar assembly.

BRIEF DESCRIPTION OF DRAWINGS

The present invention will now be described, by way of example with reference to the accompanying drawings, in which.

DETAILED DESCRIPTION

Figure 1:
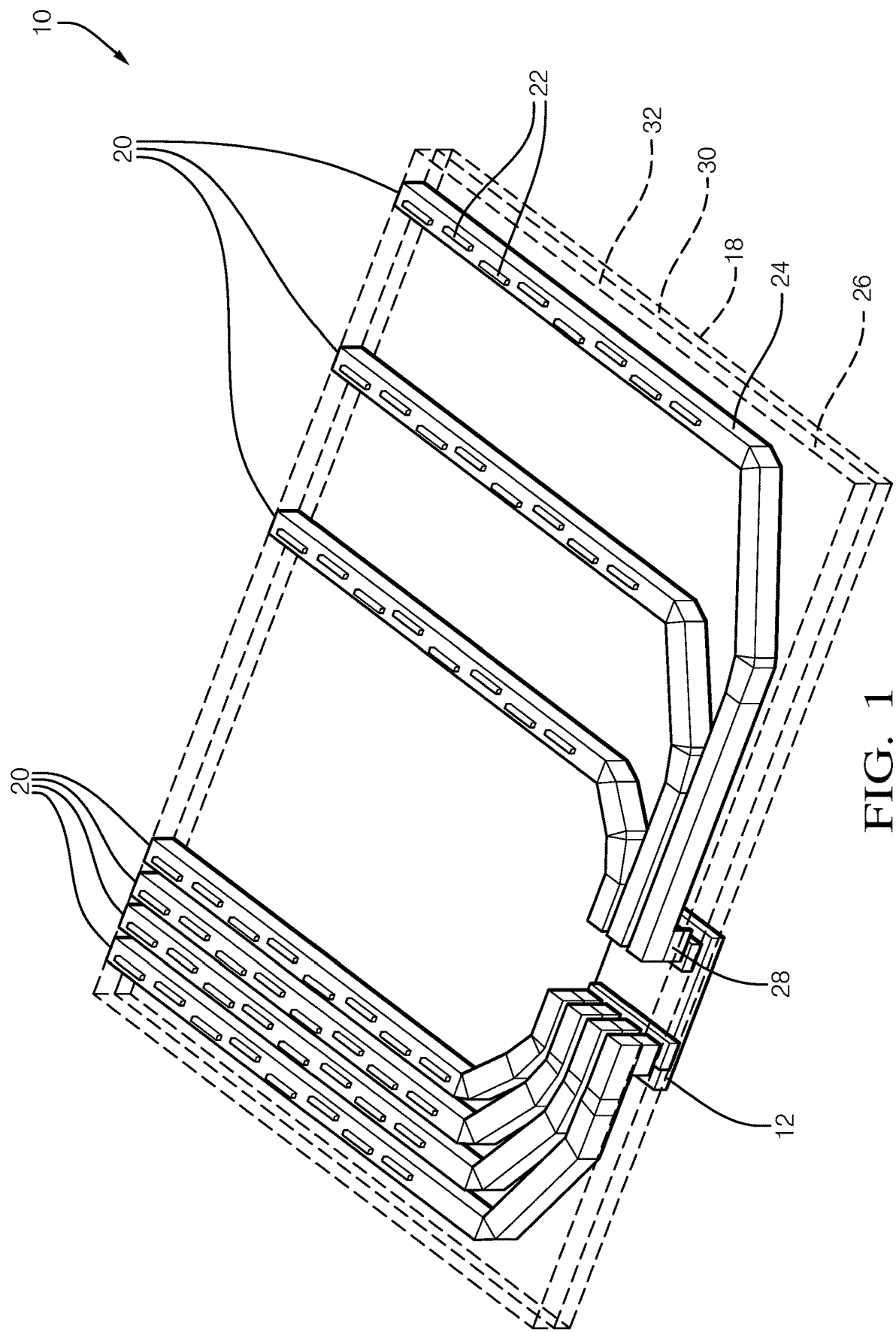
FIG. 1 is an isometric-view of a radar assembly in accordance with one embodiment.

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

'One or more' includes a function being performed by one element, a function being performed by more than one element, e.g., in a distributed fashion, several functions being performed by one element, several functions being performed by several elements, or any combination of the above.

It will also be understood that, although the terms first, second, etc. are, in some instances, used herein to describe various elements, these elements should not be limited by these terms. These terms are only used to distinguish one element from another. For example, a first contact could be termed a second contact, and, similarly, a second contact could be termed a first contact, without departing from the scope of the various described embodiments. The first contact and the second contact are both contacts, but they are not the same contact.

The terminology used in the description of the various described embodiments herein is for describing embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]," depending on the context.

Automotive radars are often required to have a high gain with a minimum aperture size and a low cost. Typically, radar-systems for automotive applications include multiple printed circuit boards (PCBs) which contain feed networks and radiators. However, the dielectric loss of such systems can be significant, especially when low cost printed-circuit-board materials are used. Described herein is a radar assembly that may be part of a radar-system used to detect objects proximate to a host-vehicle. The host-vehicle may be characterized as an automated vehicle, and may be referred to by some as an automated-mobility-on-demand (AMOD) type of vehicle. The host-vehicle may be operated in an automated-mode, i.e. a fully autonomous mode, where a human-operator of the host-vehicle may do little more than designate a destination to operate the host-vehicle. Accordingly, the host-vehicle may be referred to as an automated vehicle. However, it is contemplated that the teachings presented herein are useful when the host-vehicle is operated in a manual-mode where the degree or level of automation may be little more than providing an audible or visual warning to the human-operator who is generally in control of the steering, accelerator, and brakes of the host-vehicle. For example, the radar-system may merely assist the human-operator as needed to change lanes and/or avoid interference with and/or a collision with, for example, an object such as another-vehicle, a pedestrian, or a road sign.

Described herein is a radar assembly that uses an innovative way to directly connect a monolithic-microwave-integrated-circuit (MMIC) to an air waveguide which radiates a radar-signal through radiation-slots formed in the waveguide, and does so without any substantive dielectric loss, while also providing for reduced cost. In one embodiment, the radar assembly or radar-system is based on a single FR4 circuit board that includes conductor layers for radar control-signal routing, an MMIC to ridge air waveguide transition or transition-feature, a ridge-air-waveguide, and air waveguide radiator-slots. The MMIC is preferably directly soldered on bottom of the FR4 circuit board using a solder-ball reflow process. Multiple layers of metal conductor in the FR4 circuit board are allocated for radar control-signals, i.e. relatively low-frequency. In one embodiment, air cavities are cut in FR4 then are plated with copper to form the transition-feature, the air waveguide, and radiation-slots for the relatively high-frequency signals emitted and detected by the radar-system.

FIG. 1 illustrates a non-limiting example of a radar assembly 10, hereafter often referred to as the assembly 10, which may be part of a radar-system (not shown) that includes, for example, but is not limited to, a housing and mounting hardware for the assembly 10, and/or additional electronics for controlling or selecting radar-signals emitted by the assembly 10 and processing radar-signals detected using the assembly 10 to detect and track targets proximate to the radar-system.

The assembly 10 includes a monolithic-microwave-integrated-circuit 12 (MMIC 12). The MMIC 12 includes an arrangement 14, see FIGS. 5A and 5B, of solder-balls 16 configured to couple relatively high-frequency, e.g. greater than 10 GHz, radar-signals into or out of the MMIC 12, which may be emitted and/or detected by the MMIC 12, which is not shown in FIGS. 5A and 5B. As will be recognized by those in the art, the MMIC 12 may also input and output relatively low-frequency signals, e.g. less than 10 MHz, that may be commonly called control-signals. Those control-signals may also be connected or propagated via other-solder-balls that may also be used to directly attach the MMIC 12 to a PCB.

Figure 3:
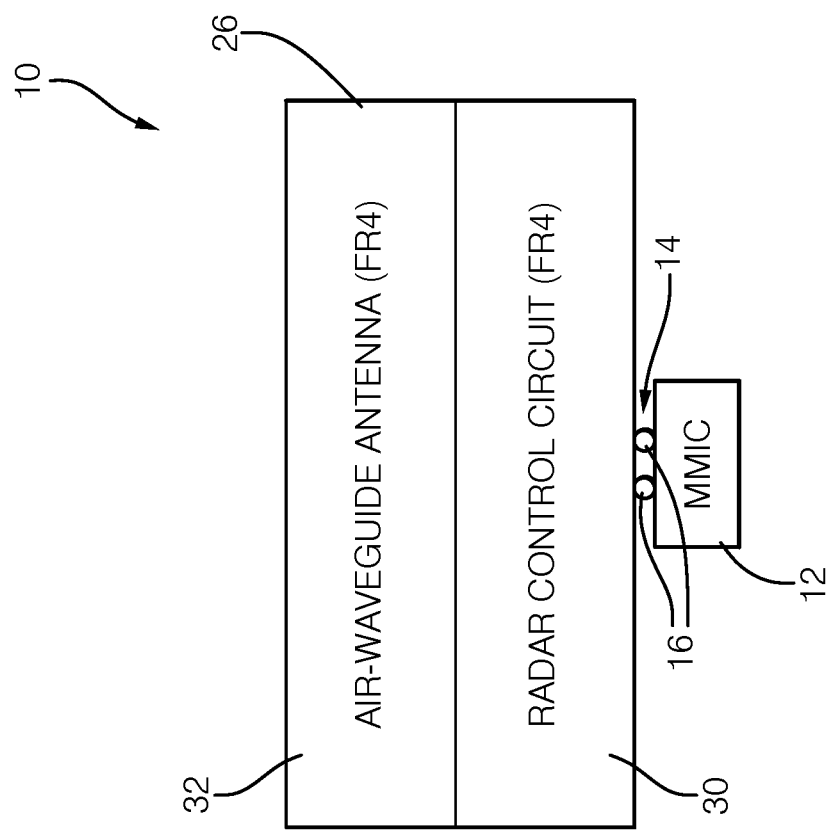
FIG. 3 is a side-view of the radar assembly of FIG. 1 in accordance with one embodiment.
Figure 2:
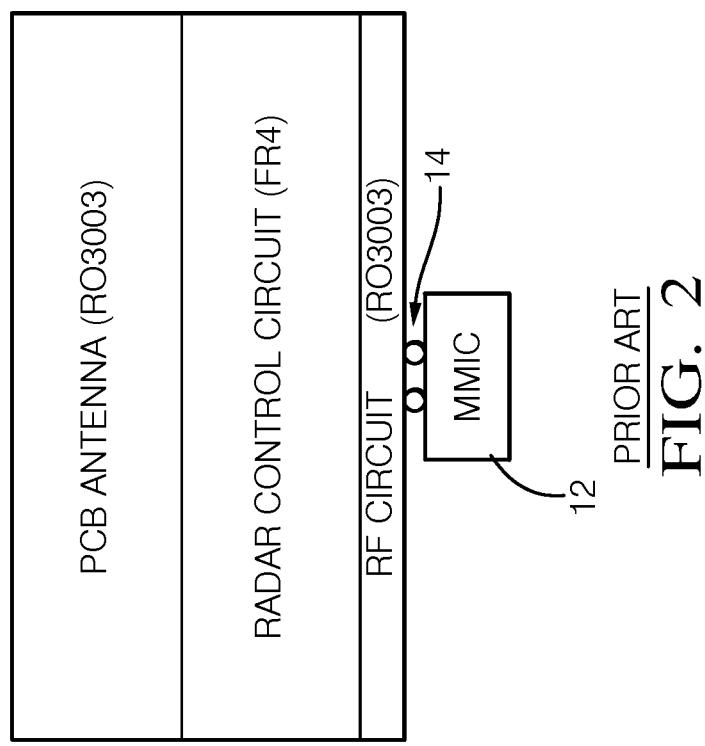
FIG. 2 is a side-view of a known radar assembly in accordance with one embodiment.

The assembly 10 includes a single printed-circuit-board 18 (PCB 18). As used herein, the modifier 'single' is used to exclude or avoid or distinguish from radar-assembly designs and prior art with multiple circuit boards and/or multiple types of circuit boards, i.e. designs that used more than one type of dielectric materials for forming the substrates of the multiple circuit boards that may be layered together to form a unified circuit board. By way of further example, FIG. 2 shows an example of multiple types (e.g. FR4 and RO3003 from Rogers Corporation) of circuit boards layered together. RO3003 is a known substrate material often used for high-frequency applications, e.g. radar, because of the dielectric properties, e.g. the dielectric-constant or relative-permittivity of substrate material. By contrast, the PCB 18 of the radar assembly 10 described herein is advantageously formed of a single type of laminate-material, for example FR4, as shown in FIG. 3. Also, as used herein, the modifier 'directly' is used to exclude or avoid or distinguish from designs and prior art that suggest using a small printed circuit board formed of high-frequency material (e.g. RO3003) between a relatively low-frequency circuit board and/or antenna-elements of the assembly 10 or the system.

Figure 4:
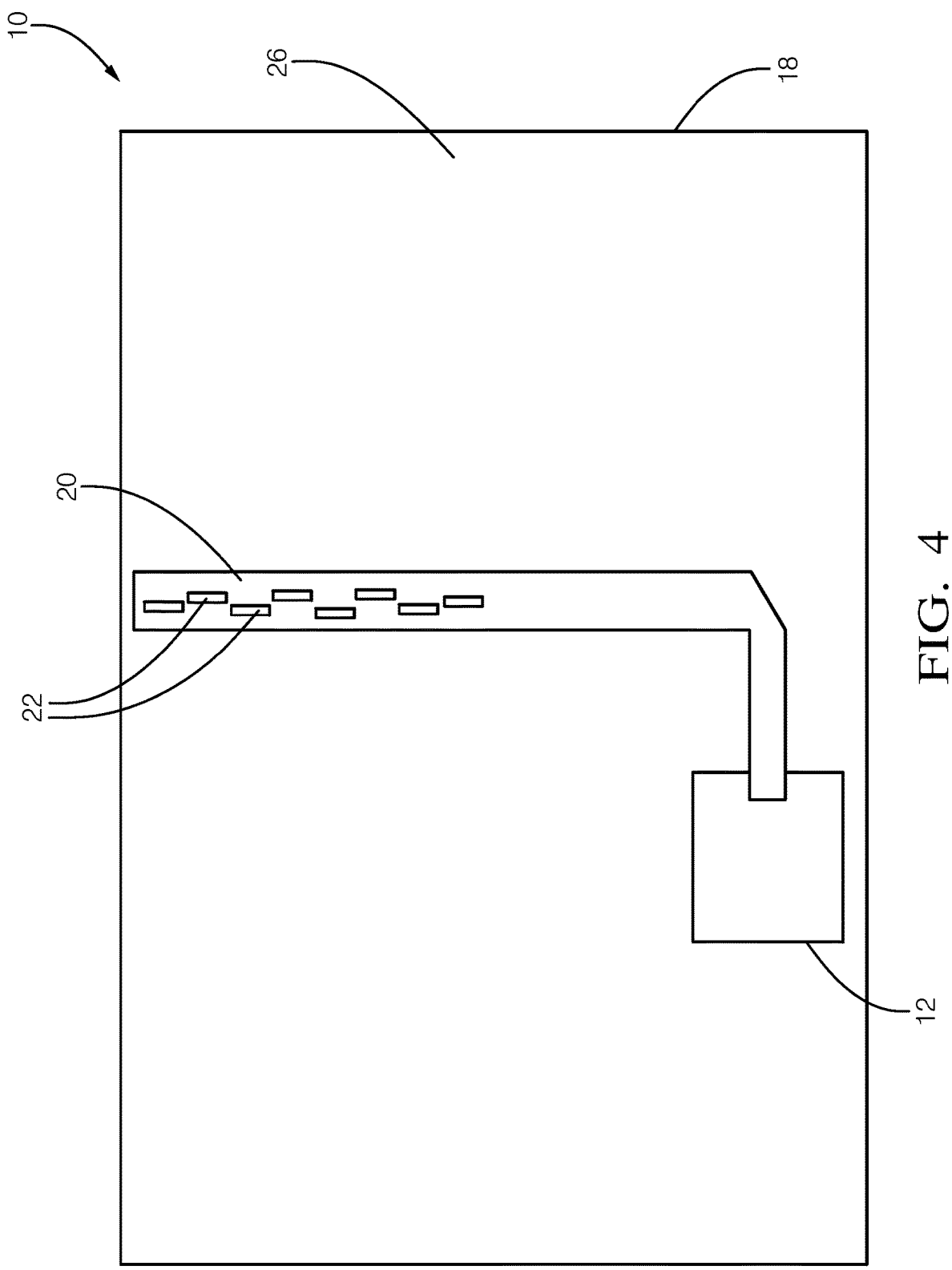
FIG. 4 is a top-view of the radar assembly of FIG. 1 in accordance with one embodiment.

The assembly 10 includes at least one instance of an antenna-element 20 as shown in FIG. 4, or may include multiple instances of the antenna-element 20 as shown in FIG. 1. The antenna-element 20 may be characterize as integral with or integral to the PCB 18, i.e. is built into the PCB 18 or fabricated at the same time the PCB 18 is fabricated. Alternatively, it is contemplated that the antenna-element 20 could be formed of a separate sheet of formed (e.g. stamped/punched) metal or foil to define antenna-element 20. The antenna-element 20 includes, i.e. is configure to define, one or more radiation-slots 22 configured to couple radar-signals into the antenna-element from the surrounding environment (i.e. receive radar-signals), and/or out of the antenna-element into (i.e. broadcast radar-signals).

Figure 8A:
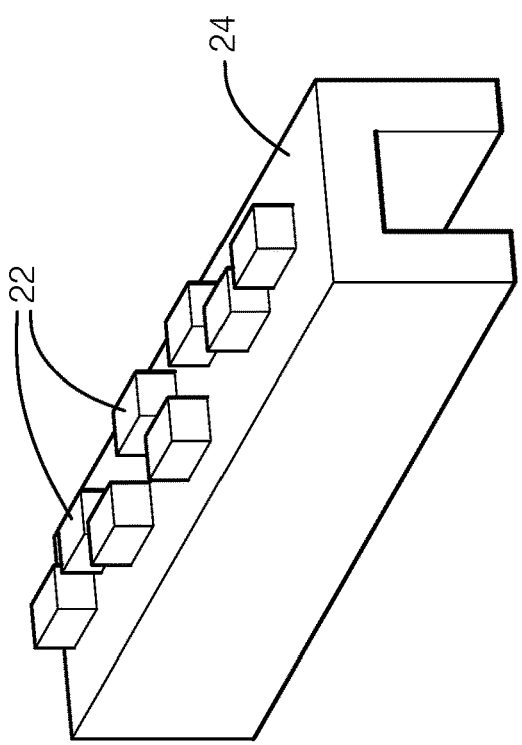
FIGS. 8A, 8B, 8C, and 8D are various views an antenna-element of the radar assembly of FIG. 1 in accordance with one embodiment.
Figure 8B:
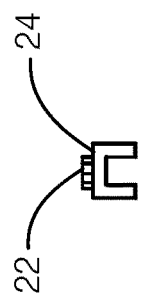
Figure 8C:
Figure 8D:
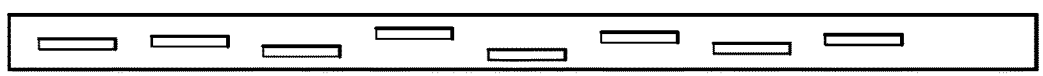

The antenna-element 20 includes an air-waveguide, in particular, a ridge-air-waveguide 24 configured to propagate radar-signals to or from the one or more radiation-slots 22. As used herein, the ridge-air-waveguide 24 has a U-shaped cross-section as shown in FIGS. 8B and 8D. The U-shaped cross-section of the ridge-air-waveguide 24 is advantageously used so that the actual-width of the ridge-air-waveguide 24 (the width of the U) is small enough so the input/output ends of multiple instances of the antenna-element 20 can be arranged directly over the MMIC 12. As those in the art will recognized, the effective-width or the electrical-width of ridge-air-waveguide 24 is selected based on the wavelength of the radar-signals, where the effective-width or the electrical-width corresponds to the length of a line that defines the U. That is, the effective-width or the electrical-width of ridge-air-waveguide 24 is greater than the actual-width of the ridge-air-waveguide 24.

By way of example and not limitation, the air-cavities that define the antenna-elements 20 may be formed by removing areas of the substrate 26, and then various surfaces including some or all of those created by the removal of areas of the substrate 26 are plated with, for example, copper to form, for example, the ridge-air-waveguide 24 and the radiation-slots 22 of the antenna-element 20. FIGS. 8A, 8B, 8C, and 8D illustrate non-limiting examples of various structures, e.g. the ridge-air-waveguide 24 and the radiation-slots 22 formed by the plating with all other parts of the PCB 18 being removed. It is noted that only the metal plating is shown, and the material that forms the substrate 26 is not shown in FIGS. 8A, 8B, 8C, and 8D.

Figure 6:
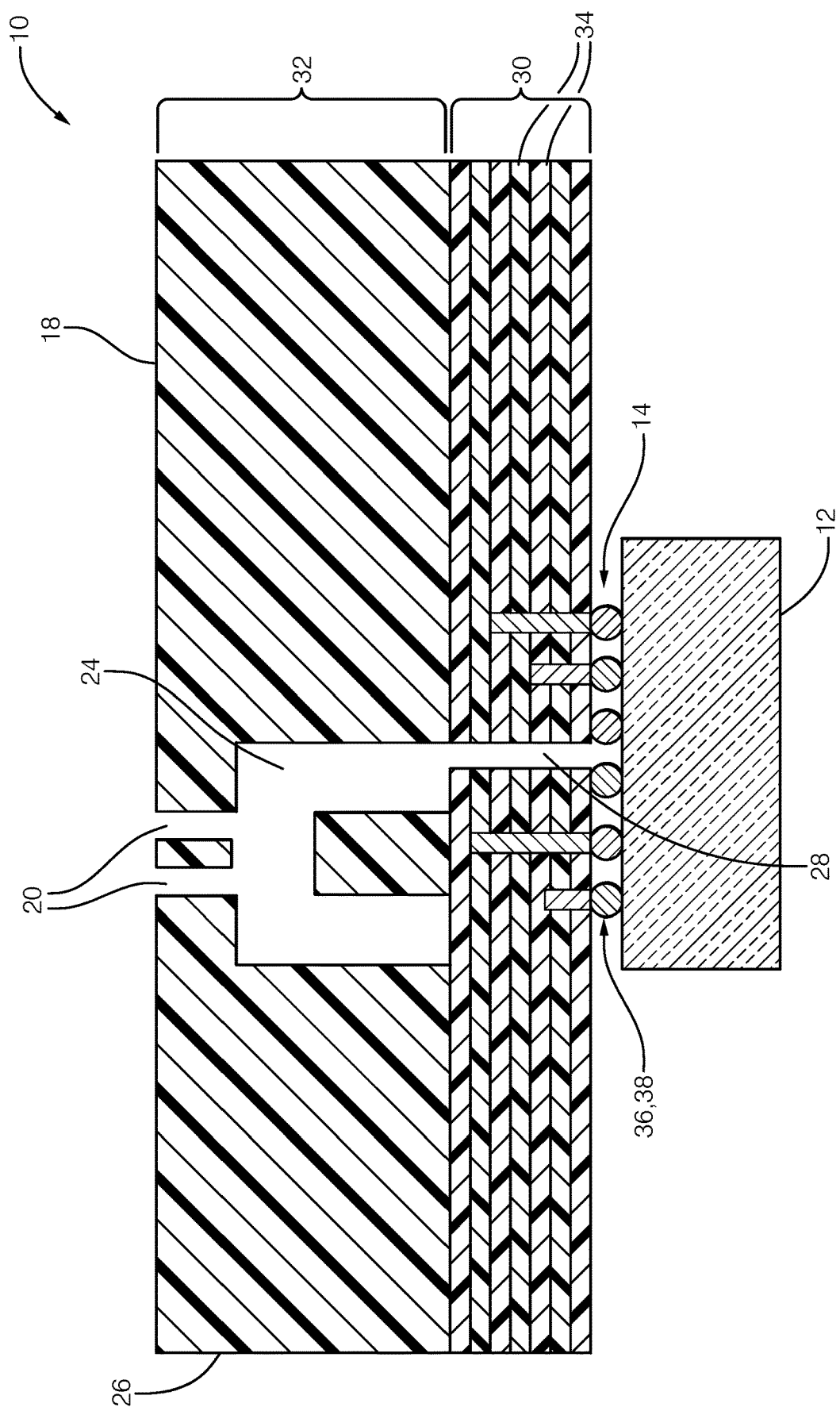
FIG. 6 is a sectional side-view of the radar assembly of FIG. 1 in accordance with one embodiment.
Figure 7C:
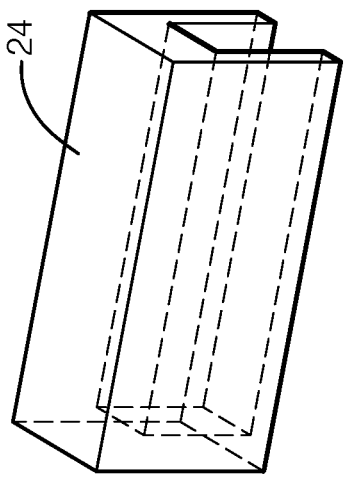
FIGS. 7A, 7B, 7C, 7D, and 7E are various views partial assembles of the radar assembly of FIG. 1 in accordance with one embodiment.
Figure 7E:
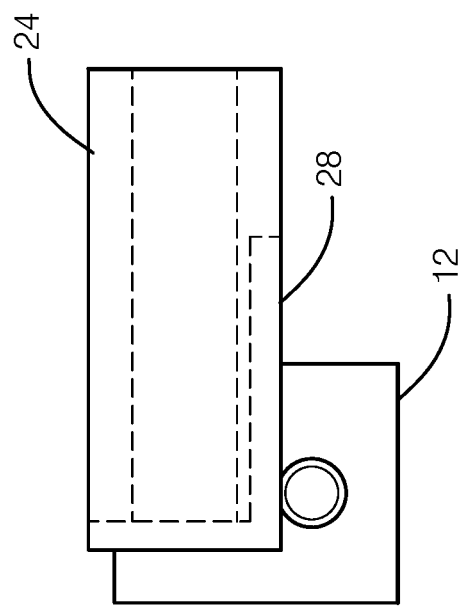
Figure 7B:
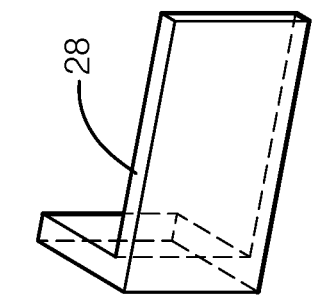
Figure 7A:
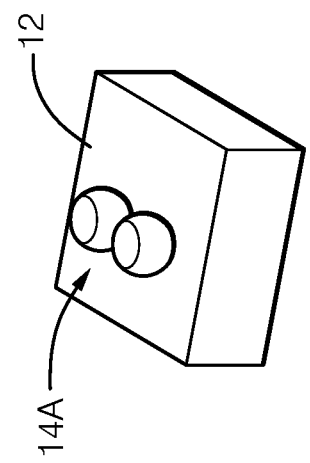
Figure 7D:
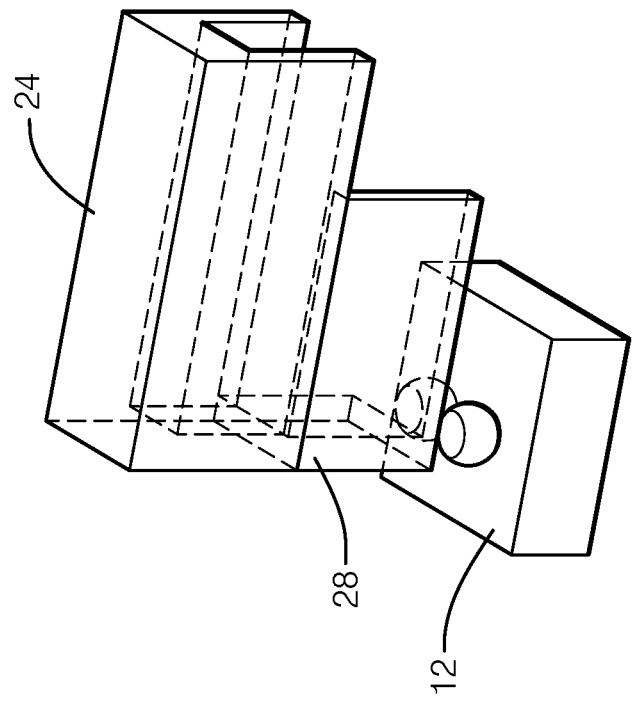

With the termination ends of the antenna-elements 20 sized as described above and arranged directly over the MMIC 12, which in this example is about ten-millimeters on a side, it is possible to avoid the added expense and complexity of using a high-frequency substrate to provide for a means to distribute radar signals from the relatively small area of the MMIC 12 to a larger area necessitated by the antenna-elements 20 not having or being based on or distributed by one or more instances of the ridge-air-waveguide 24. To complete the connection between the MMIC 12 and the antenna-element 20, the PCB 18 includes a transition-feature 28 configured to couple radar-signals between the arrangement 14 of solder-balls 16 and the ridge-air-waveguide 24 of the antenna-element 20. The transition-feature 28 is an air-waveguide that is characterized as a slot, and the slot extends between the arrangement 14 of solder-balls 16 and the ridge-air-waveguide 24. FIG. 6 illustrates a non-limiting example of a sectional end-view of an embodiment of the assembly 10 that suggests the relationship between the transition-feature 28, the ridge-air-waveguide 24, and the radiation-slots 22.

Figure 5B:
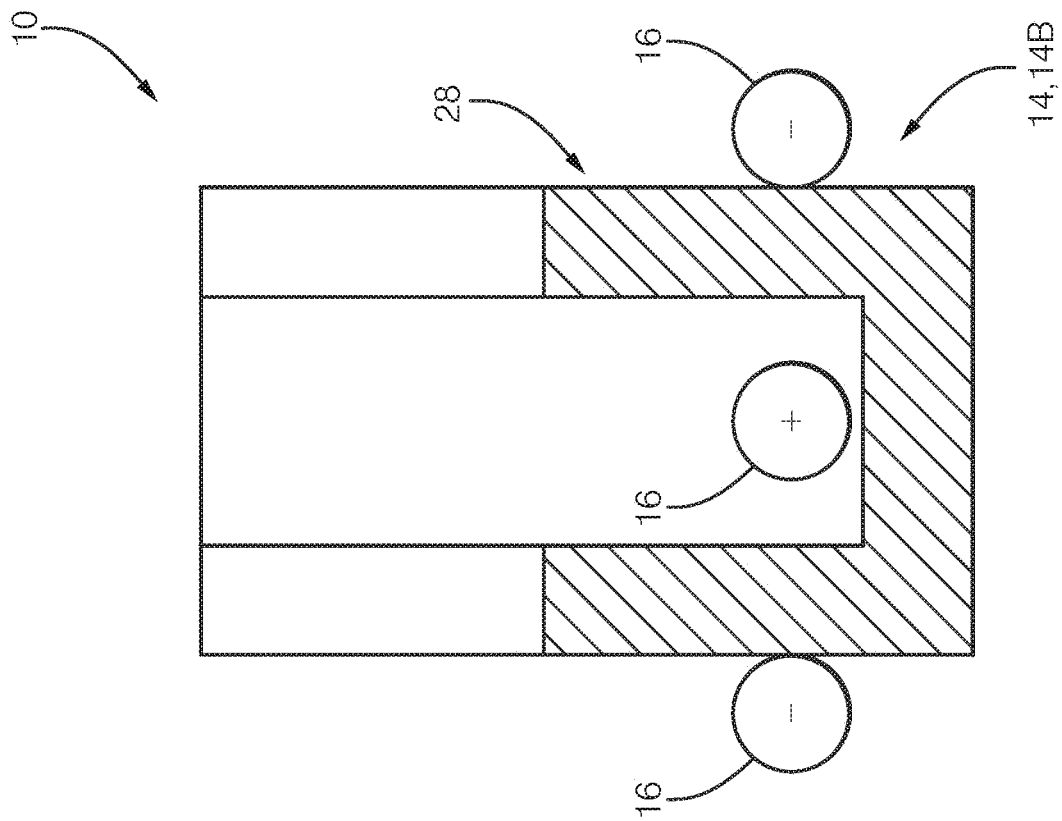
FIG. 5B is a sectional top-view of a U-shaped transition-feature of the radar assembly of FIG. 1 in accordance with one embodiment.
Figure 5A:
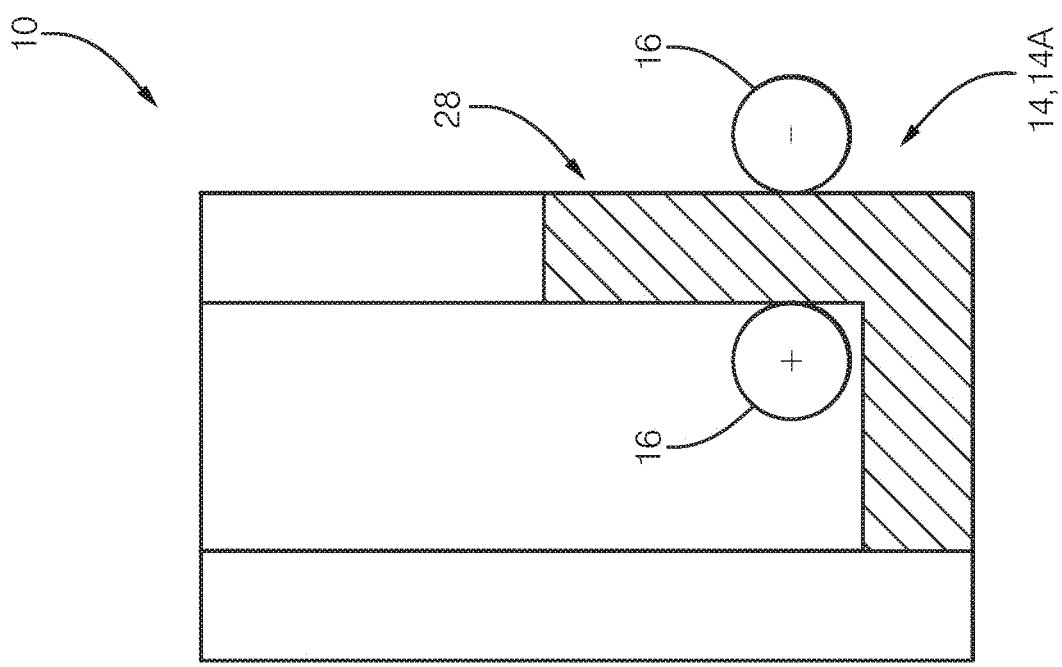
FIG. 5A is a sectional top-view of an L-shaped transition-feature of the radar assembly of FIG. 1 in accordance with one embodiment.

FIG. 5A shows a non-limiting example of part of the assembly 10 where the arrangement 14 of solder-balls 16 is characterized as a solder-ball-pair 14A. That two solder-balls are used is typically determined by the design or configuration of the radar-signal input/output of the MMIC 12. For the solder-ball-pair 14A it may be advantageous for the transition-feature 28 to be configured as or characterized as an L-shaped-slot. FIGS. 7A, 7B, 7C, 7D, and 7E show various perspective views of the MMIC 12, the transition-feature 28 and the ridge-air-waveguide 24. Signals to/from the MMIC 12 are electromagnetically coupled to the transition-feature 28, which is an "L" shaped slot, to/from bottom of the transition-feature 28, and the upper side of the transition-feature 28 feeds the end of a ridge-air-waveguide 24. Note that the end of the ridge part of the ridge-air-waveguide 24 is not touching the end wall of the ridge-air-waveguide 24. The topology of this transition makes it possible for the termination ends of the antenna-element 20 to be narrow enough to fit seven ridge air waveguides to the seven RF ports of the relatively small MMIC as shown in FIG. 1.

FIG. 5B shows a non-limiting example of part of the assembly 10 where the arrangement 14 of solder-balls 16 is characterized as a solder-ball-trio 14B. As above, that three solder-balls are used is generally determined by the design or configuration of the radar-signal input/output of the MMIC 12. For the solder-ball-trio 14B it may be advantageous for the transition-feature 28 to be configured as or characterized as a U-shaped-slot. Note that the end of the ridge part of the ridge-air-waveguide 24 is not touching the end wall of the ridge-air-waveguide 24.

Figure 9A:
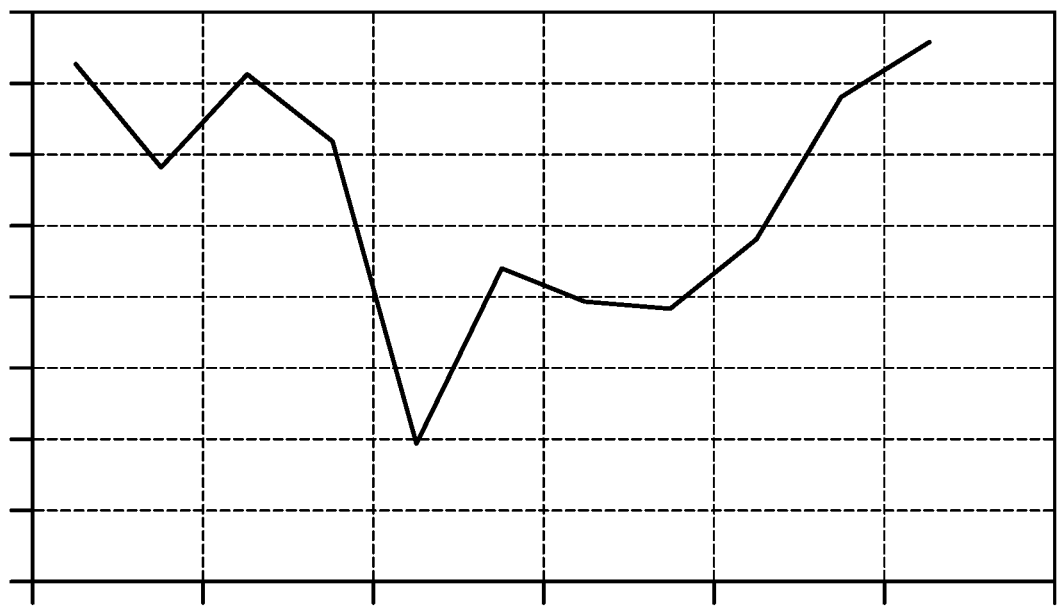
FIGS. 9A and 9B are graphs of performance characteristics of the radar assembly of FIG. 1 in accordance with one embodiment.
Figure 9B:
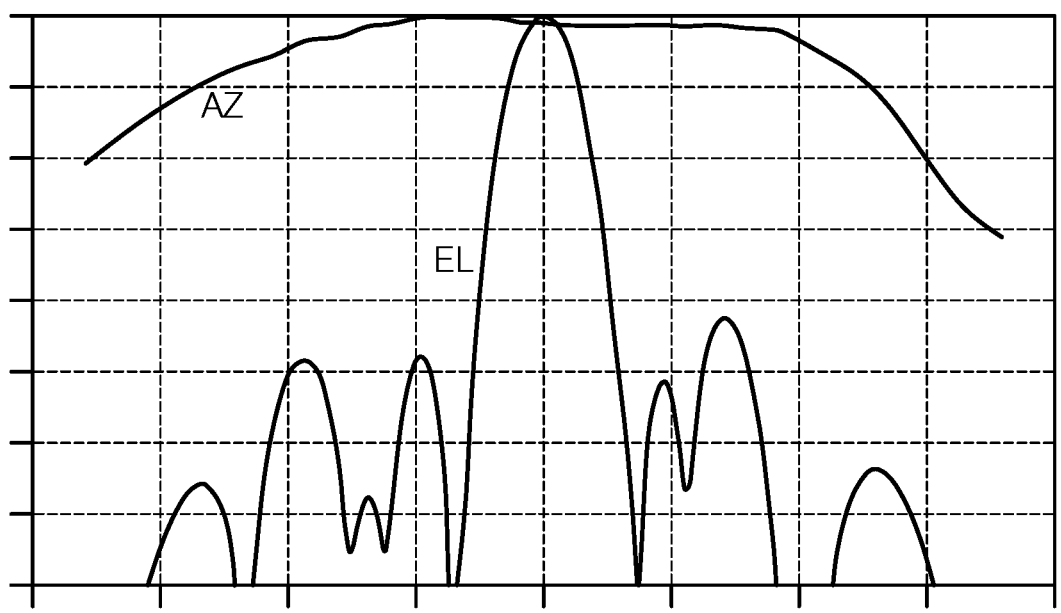

The radiation-slots 22 depicted in FIGS. 8A-8D are opened on the top side or broad side of the ridge-air-waveguide 24, i.e. the top portion of an upside-down U, thereby forming what some refer to as an end-fed waveguide slot array antenna. The width of the ridge-air-waveguide 24 allows a radiator formed of multiple antenna-elements that is narrow enough to form an array without grating lobes. The cross section of the ridge-air-waveguide 24 can be individually optimized for transition and for radiator, a taper in between can bridge the two together. FIG. 1 illustrates a design example for radar-signals of 76.5 GHz, where four receive antennas are separated by half wavelengths, and the three transmit antennas are separated by two and half wavelengths. Matching at the ports or radar-signal inputs/outputs of the MMIC is good, radiation pattern has a wide field of view in azimuth, and a 10 deg beam width in elevation with side-lobe below −20 dB, as shown in FIGS. 9A and 9B. Advantageously, the design is purposely selected for typical PCB fabrication processes and for minimal manufactural cost.

Referring again to FIG. 6, in one embodiment the assembly 10 includes a monolithic-microwave-integrated-circuit 12 (MMIC 12), and a single printed-circuit-board 18 (PCB 18) formed of a single type of laminate-material and directly attached to the MMIC 12. The MMIC 12 includes an arrangement 14 of solder-balls 16 configured to couple radar-signals into or out of the MMIC 12. The PCB 18 includes a lower portion 30 adjacent to the MMIC 12 and an upper-portion 32 opposite the lower-portion 30 with respect to the MMIC 12. The upper-portion 32 includes an antenna-element 20 that includes one or more radiation-slots 22 configured to couple radar-signals into or out of the antenna-element 20, and a ridge-air-waveguide 24 configured to propagate radar-signals to or from the one or more radiation-slots 22. The lower-portion 30 includes one or more conductor-layers 34 configured to communicate one or more control-signals to the MMIC 12, and a transition-feature 28 configured to couple radar-signals between the arrangement 14 of solder-balls 16 and the ridge-air-waveguide 24. The transition-feature 28 is characterized as a slot that extends through the lower-portion 30 between the arrangement 14 of solder-balls 16 and the ridge-air-waveguide 24. The surfaces that define the ridge-air-waveguide 24 and the transition-feature 28 are plated with metal.

Also described herein, a printed-circuit-board 18 (PCB 18) for a radar assembly 10 is provided. The PCB 18 includes a substrate 26 formed of a single type of laminate-material, and an array 36 of solder-pads 38 on a surface of the substrate 26. The array 36 of solder-pads 38 is configured for making a direct connection to an arrangement 14 of solder-balls 16 of a monolithic-microwave-integrated-circuit 12 or MMIC 12. The arrangement 14 of solder-balls 16 configured to couple radar-signals into or out of the MMIC 12. The PCB 18 includes or defines a lower portion 30 adjacent to the solder-pads and an upper-portion 32 opposite the lower-portion 30 with respect to the solder-pads 38. The upper-portion 32 includes an antenna-element 20 that includes or defines one or more radiation-slots 22 configured to couple radar-signals into or out of the antenna-element 20, and a ridge-air-waveguide 24 configured to propagate radar-signals to or from the one or more radiation-slots 22. The lower portion 30 includes one or more conductor-layers 34 configured to communicate one or more control-signals to the MMIC 12, and a transition-feature 28 configured to couple radar-signals through the lower-layer between the arrangement 14 of solder-balls 16 and the ridge-air-waveguide 24. The transition-feature 28 is characterized as a slot that extends through the lower-portion 30 between the arrangement 14 of solder-balls 16 and the ridge-air-waveguide 24.

If the arrangement 14 of solder-balls 16 is characterized as a solder-ball-pair 14A, then the transition-feature 28 is preferably, i.e. is characterized as, an L-shaped-slot. If the arrangement 14 of solder-balls 16 is characterized as a solder-ball-trio 14B, then the transition-feature 28 is preferably, i.e. is characterized, as a U-shaped-slot. If dielectric material such as FR4 is used for the substrate 26, the air cavity surfaces that define the ridge-air-waveguide 24 and the transition-feature 28 and radiation-slots 22 may be plated with metal. However, plating is not necessary if the upper-portion 32 is built from formed/stamped metal foil.

Accordingly, a radar assembly 10 (the assembly 10), and a printed-circuit-board 18 (PCB 18) are provided. The narrow air waveguides provided by the ridge-air-waveguide 24 in combination with a transition air wave guide provided or defined by the transition-feature 28 described herein result in a means to transmit and receive radar-signal with very little or no transmission losses, while being more economical to manufacture that prior radar assemblies. The assembly is designed/configured to be compatible with known printed circuit board fabrication processes.

While this invention has been described in terms of the preferred embodiments thereof, it is not intended to be so limited, but rather only to the extent set forth in the claims that follow.

I claim:

1. A radar assembly, said assembly comprising:
a monolithic-microwave-integrated-circuit, wherein the monolithic-microwave-integrated-circuit includes an arrangement of solder-balls configured to couple radar-signals into or out of the monolithic-microwave-integrated-circuit;
an antenna-element that includes one or more radiation-slots configured to couple the radar-signals into or out of the antenna-element, and a ridge-air-waveguide configured to propagate radar-signals to or from the one or more radiation-slots; and
a single printed-circuit-board directly attached to the monolithic-microwave-integrated-circuit, said single printed-circuit-board includes a transition-feature configured to couple the radar-signals between the arrangement of solder-balls and the ridge-air-waveguide, wherein the transition-feature is characterized as a slot that extends between the arrangement of solder-balls and the ridge-air-waveguide, wherein the arrangement of solder-balls is characterized as a solder-ball-pair, and the transition-feature is characterized as an L-shaped-slot, or wherein the arrangement of solder-balls is characterized as a solder-ball-trio, and the transition-feature is characterized as a U-shaped-slot.

2. The assembly in accordance with claim 1, wherein the single printed-circuit-board is formed of a single type of laminate-material.

3. The assembly in accordance with claim 2, wherein the type of the laminate-material is FR-4.

4. The assembly in accordance with claim 2, wherein the antenna-element is characterized as integral with the single printed-circuit-board.

5. The assembly in accordance with claim 1, wherein surfaces that define the ridge-air-waveguide and the transition-feature are plated with metal.

6. The assembly in accordance with claim 1, wherein the assembly includes other-solder-balls that directly attach the monolithic-microwave-integrated-circuit to the single printed-circuit-board.

7. A radar assembly, said assembly comprising:
a monolithic-microwave-integrated-circuit, wherein the monolithic-microwave-integrated-circuit includes an arrangement of solder-balls configured to couple radar-signals into or out of the monolithic-microwave-integrated-circuit; and
a single printed-circuit-board formed of a single type of laminate-material and directly attached to the monolithic-microwave-integrated-circuit, said single printed-circuit-board includes a lower portion adjacent to the monolithic-microwave-integrated-circuit and an upper-portion opposite the lower-portion with respect to the monolithic-microwave-integrated-circuit,
said upper-portion includes an antenna-element that includes one or more radiation-slots configured to couple the radar-signals into or out of the antenna-element, and a ridge-air-waveguide configured to propagate radar-signals to or from the one or more radiation-slots,
said lower-portion includes one or more conductor-layers configured to communicate one or more control-signals to the monolithic-microwave-integrated-circuit, and
a transition-feature configured to couple the radar-signals between the arrangement of solder-balls and the ridge-air-waveguide, wherein the transition-feature is characterized as a slot that extends through the lower-portion between the arrangement of solder-balls and the ridge-air-waveguide, and surfaces that define the ridge-air-waveguide and the transition-feature are plated with metal,
wherein the arrangement of solder-balls is characterized as a solder-ball-pair, and the transition-feature is characterized as an L-shaped-slot, or
wherein the arrangement of solder-balls is characterized as a solder-ball-trio, and the transition-feature is characterized as a U-shaped-slot.

8. The assembly in accordance with claim 7, wherein the single type of laminate-material is FR-4, and wherein the antenna-element is characterized as integral with the single printed-circuit-board.

9. The assembly in accordance with claim 7, wherein the assembly includes other-solder-balls that directly attach the monolithic-microwave-integrated-circuit to the single printed-circuit-board.

10. A printed-circuit-board for a radar assembly, said printed-circuit-board comprising:
a substrate formed of a single type of laminate-material;
an arrangement of solder-pads on a surface of the substrate, said arrangement of solder-pads configured for making a direct connection to an arrangement of solder-balls of a monolithic-microwave-integrated-circuit, said arrangement of solder-balls configured to couple radar-signals into or out of the monolithic-microwave-integrated-circuit;
said printed-circuit-board includes a lower portion adjacent to the solder-pads and an upper-portion opposite the lower-portion with respect to the solder-pads,
said upper-portion includes an antenna-element that includes one or more radiation-slots configured to couple the radar-signals into or out of the antenna-element, and a ridge-air-waveguide configured to propagate radar-signals to or from the one or more radiation-slots,
said lower portion includes one or more conductor-layers configured to communicate one or more control-signals to the monolithic-microwave-integrated-circuit, and a transition-feature configured to couple the radar-signals through the lower-layer between the arrangement of solder-balls and the ridge-air-waveguide, said transition-feature characterized as a slot that extends through the lower-portion between the arrangement of solder-balls and the ridge-air-waveguide.

11. The printed-circuit-board in accordance with claim 10, wherein the arrangement of solder-balls is characterized as a solder-ball-pair, and the transition-feature characterized as an L-shaped-slot.

12. The printed-circuit-board in accordance with claim 10, wherein the arrangement of solder-balls is characterized as a solder-ball-trio, and the transition-feature characterized as a U-shaped-slot.

13. The printed-circuit-board in accordance with claim 10, wherein surfaces that define the ridge-air-waveguide and the transition-feature are plated with metal.

14. The printed circuit board in accordance with claim 10, wherein the single type of laminate-material is FR-4.

15. The printed circuit board in accordance with claim 10, wherein the antenna-element is characterized as integral with the printed-circuit-board.

16. The printed circuit board in accordance with claim 10, wherein surfaces that define the ridge-air-waveguide and the transition-feature are plated with metal.

17. The printed circuit board in accordance with claim 10, wherein the radar assembly includes other-solder-balls that directly attach the monolithic-microwave-integrated-circuit to the printed-circuit-board.

* * * * *